United States Patent [19]

Taylor et al.

[11] Patent Number: 5,015,971

[45] Date of Patent: May 14, 1991

[54] FREQUENCY AGILE MICROWAVE SIGNAL GENERATOR

[75] Inventors: Stephen D. Taylor, Agoura; Paul I. Tanaka, Lawndale, both of Calif.

[73] Assignee: Hughes Aircraft Company, Los Angeles, Calif.

[21] Appl. No.: 455,675

[22] Filed: Dec. 22, 1989

[51] Int. Cl.⁵ .......................... H03L 7/12; H03L 7/20
[52] U.S. Cl. ........................................ 331/16; 331/4; 331/19; 331/DIG. 2
[58] Field of Search ...................... 331/2, 4, 9, 14, 16, 331/18, 19, 25, DIG. 2; 455/260

[56] References Cited

U.S. PATENT DOCUMENTS

4,513,448  4/1985  Maher ................................ 331/19 X

Primary Examiner—David Mis
Attorney, Agent, or Firm—Leonard A. Alkov; Wanda K. Denson-Low

[57] ABSTRACT

A frequency synthesized, microwave signal generator is disclosed that provides multiple channel frequency selection capability with rapid channel change time and low levels of spurious signals and noise. The generator uses a microwave harmonic phase locked loop to lock a microwave VCO to a programmable harmonic of a VHF reference crystal oscillator to provide coarse frequency control in steps equal to that reference frequency. The phase lock loop includes an offset mixer for injecting an offset signal frequency to achieve fine frequency control. A harmonic detection and counting scheme is used to rapidly sweep the harmonic loop and obtain phase lock at the desired harmonic.

11 Claims, 5 Drawing Sheets

FIG.5B MICROWAVE INPUT

FIG.5C SAMPLE CLOCK

FREQUENCY AGILE MICROWAVE SIGNAL GENERATOR

BACKGROUND OF THE INVENTION

The invention relates to frequency synthesized microwave signal generators having particular application as signal generators for radar transmitter and receiver local oscillators requiring frequency stability, spectral purity, frequency agility, wide operating bandwidth and relatively small packaged volume.

Signal generators that are used to produce tactical airborne radar transmitter and receiver local oscillator (LO) signals are unique in the severity of the requirements placed on them for frequency stability, spectral purity, frequency agility, operating bandwidth and packaged volume.

Prior techniques for generating the high quality signals needed for radar applications have generally been a compromise of optimizing some parameters at the expense of others. A common prior technique uses either a frequency comb generator or a programmable harmonic phase locked loop to provide coarse (approximately 100 MHz step size) frequency control. A separate phase locked loop is used to offset the selected coarse set frequency through a mixing operation and a selectable loop reference frequency that is provided by a bank of crystal oscillators. That scheme separates the functions of coarse and fine frequency control and their combination and provides excellent noise and spurious performance at the expense of slow, 5 millisecond frequency switching and large packaging volume. Also, the technique used to control the harmonic lock ratio is restricted in practical usage to approximately six (6) coarse frequency steps.

A second prior technique uses indirect frequency synthesis and is based on the use of wide range programmable frequency dividers in the reference and feedback signal paths of a series of phase locked loops that provide progressively finer levels of frequency control. While that approach can provide arbitrarily fine frequency steps, the noise introduced by the large ratio dividers results in degraded output FM noise performance.

A third prior technique uses direct frequency synthesis and is based on the use of a cascade or other combination of mixers, frequency multipliers and dividers, and filters to generate the desired frequencies. Although that approach can provide the fastest switching speed, it is generally limited in spurious performance and highly volume consuming.

SUMMARY OF THE INVENTION

A frequency synthesized, microwave signal generator is disclosed in accordance with the invention and comprises a reference oscillator for generating a reference signal at a reference frequency, and a programmable harmonic phase lock loop (PLL) responsive to said reference signal. The PLL loop is closed around a harmonic phase comparator, a voltage controlled oscillator (VCO) which supplies the ultimate output signal, and an offset signal mixer for mixing the VCO signal with a fine frequency control offset signal. The output of the offset mixer is a microwave signal fed back to the harmonic phase comparator for comparison with the reference signal. The PLL may be programmably locked to a selected harmonic of the reference signal.

The generator further comprises means for programming the harmonic PLL to a selected one of a plurality of frequency channels for providing coarse step frequency control of the generator output signal. This programming means includes a sweep generator for sweeping the VCO control signal to tune the generator to the desired frequency, and a marker filter and detector which generates a signal when the microwave signal fed back to the comparator is at the filter center frequency. This marks the microwave frequency location at the beginning of the acquisition process. A harmonic counter enabled by the marker frequency detector is clocked by a zero beat detector responsive to the comparator output to count the harmonics as the VCO sweeps, so that the sweep generator may be shut off when the desired harmonic is reached.

The generator further includes a frequency synthesizer reference signal for generating the fine frequency control signals, and in a preferred embodiment is responsive to the reference signal and may be programmed to generate one of a plurality of possible frequencies.

The generator further includes means for controlling the frequency synthesizer to generate a fine frequency control signal at a desired frequency so as to achieve fine frequency control of the output signal. Therefore, coarse step and fine frequency control are achieved by the generator in a single phase lock loop.

BRIEF DESCRIPTION OF THE DRAWINGS

These and other features and advantages of the present invention will become more apparent from the following detailed description of an exemplary embodiment thereof, as illustrated in the accompanying drawings, in which.

DETAILED DESCRIPTION OF THE PREFERRED EMBODIMENT

Figure 1:
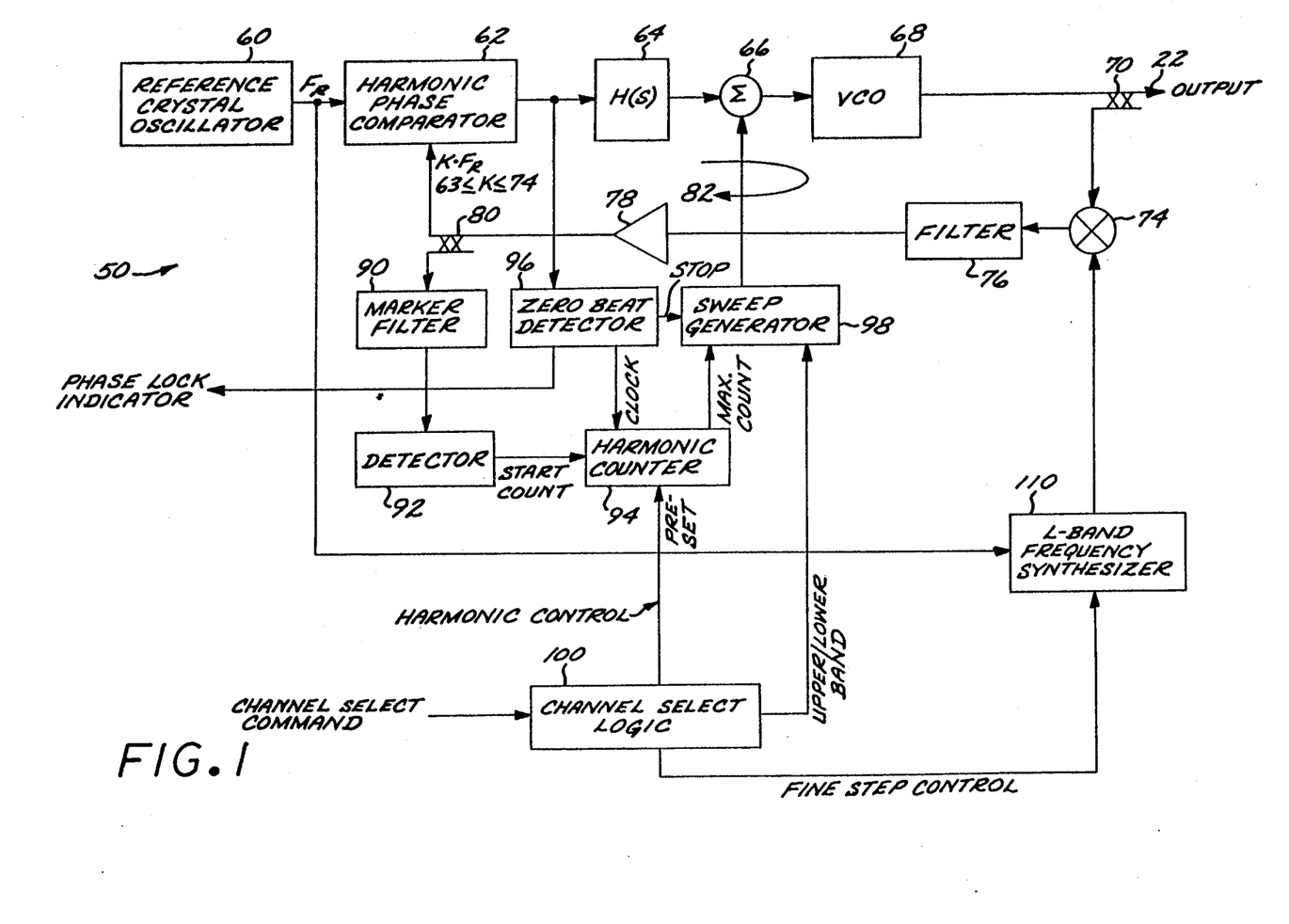
FIG. 1 is a schematic block diagram illustrative of a frequency agile microwave signal generator employing the invention.

Referring now to FIG. 1, a frequency agile microwave signal generator 50 embodying the invention comprises a programmable harmonic phase locked loop 82 that provides coarse step frequency control, an L-band frequency synthesizer 110 that provides fine step frequency control, and a VHF reference crystal oscillator 60 that supplies a common reference to the entire generator. In one preferred implementation, the harmonic loop 82 provides 12 coarse step frequencies with separations of approximately 93 MHz, and the L-band synthesizer 110 provides 8 fine step frequencies with separations equal to one-eighth of a coarse step. In total, this preferred embodiment of the generator provides 96 channels spanning an 1100 MHz band.

The harmonic phase locked loop is closed around a harmonic phase comparator 62, summer 66, loop amplification and compensation (H(s)) 64, microwave voltage controlled oscillator (VCO) 68, mixer 74, filter network 76, amplifier 78, and coupler 80. The harmonic phase comparator 62 functions to compare the phase of the Nth harmonic of the reference signal from the reference oscillator 60 and the microwave feedback signal from the filter network 76, and develop a voltage signal that is related to the phase difference. In this exemplary application, the frequency of the reference oscillator is on the order of 93 MHz, although obviously other frequencies could instead be used. When phase locked, the feedback signal from the filter network 76 is forced to be an exact harmonic of the reference signal. Any departure from a constant steady state phase difference is sensed by the phase comparator, processed through the loop compensation 64, and applied as a correction to the VCO 68 to maintain phase lock. Since the phase comparator 62 will function in that manner for any harmonic ratio within its operating bandwidth, the loop 82 can be locked to any desired harmonic within the operating bandwidth of the microwave components. For the exemplary implementation, the lock ratios cover the range from 63 to 74, inclusive.

The frequency synthesizer 110 also supplies an input to the harmonic phase locked loop 82 to inject fine frequency control. That injection is accomplished by a mixer 74 which functions to develop a difference frequency signal from a sample of the VCO 68 output and the synthesizer 110. Since the mixer output frequency is phase locked to a harmonic of the reference signal and is therefore held constant, stepping of the synthesizer 110 frequency forces corresponding stepping of the VCO frequency as desired. In the exemplary embodiment, the frequency synthesizer 110 operates at L-band.

The filter 76 at the mixer 74 output functions to remove spurious mixer signals and leakage of the VCO signal through the mixer 74. To improve the spurious signal control when the output frequency band is close to the mixer output signal band, the filter 76 can comprise a switched filter network comprising two or more filters, each filter tuned to a particular portion of the band. The corresponding filter can then be switched into the loop in dependence on the mixer output signal frequency range.

Figure 2:
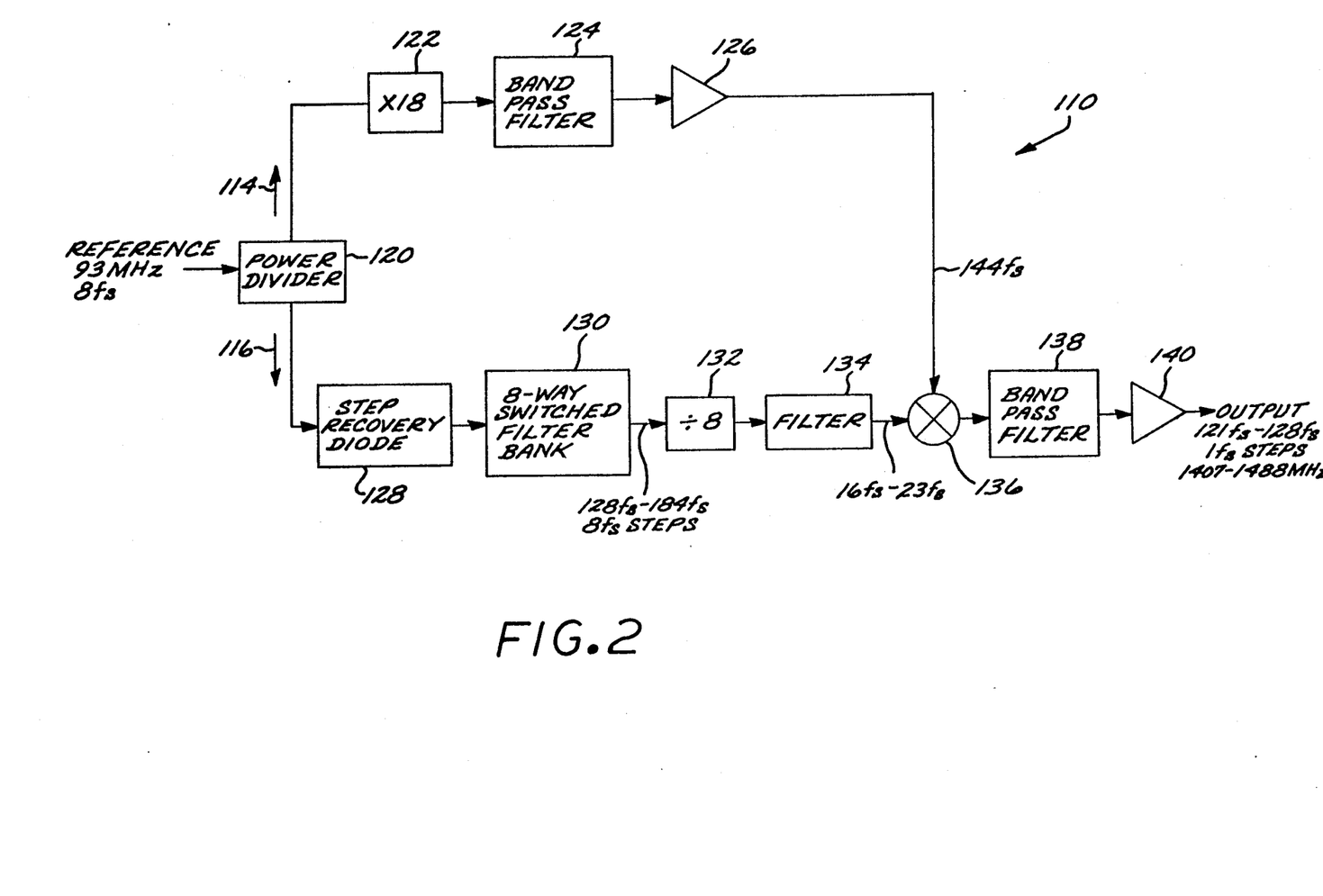
FIG. 2 is a simplified block diagram of an L-band frequency synthesizer suitable for use in the signal generator of FIG. 1.

The implementation of the L-band synthesizer 110 is not, of itself, an aspect of this invention. Of importance, however, is the selection of a synthesizer that will provide noise, spurious signal, and frequency switching time performance that is compatible with a particular application. In particular the implementation should be selected to locate all spurious signals at integer multiples of the synthesizer channel frequency spacing to preserve the excellent spurious performance of the microwave harmonic loop. An example of an L-band frequency synthesizer 110 that can provide the fine frequency control and other needed performance for the disclosed embodiment of the invention is shown in FIG. 2. The exemplary synthesizer uses a direct frequency synthesis scheme to derive eight selectable output frequencies from the 93 MHz reference frequency through a combination of frequency multiplication, division, and mixing functions. As shown in FIG. 2, the input 93 MHz reference frequency, at eight times the synthesizer frequency step size $f_s$ (=11.6 MHz in this embodiment) (8$f_s$) is divided by power divider 120 into two paths 114 and 116. The signal in path 114 is frequency multiplied by multiplier 122 by a factor of 18 to 1674 MHz (144 $f_s$). The signal at the second path 116 feeds a step recover diode voltage impulse generator 128 to generate a comb of frequencies at harmonics of the 93 MHz input. An eight-way, switched filter bank 130 provides selection of one-of-eight frequencies from this comb in the range of the 16th through the 23rd harmonic, inclusive. The frequency division 132 by eight that follows the filter bank 130 produces a frequency selectable in the range of 16 $f_s$ to 23 $f_s$ in increments of $f_s$, the synthesizer 11.6 MHz channel frequency spacing. The mixer 136 functions to upconvert this frequency to the L-band range by mixing with the signal developed in the other path 114. The filtering 138 at the mixer output extracts the difference frequency component in the range of 1407 MHz to 1488 MHz (121 $f_s$ to 128 $f_s$) as the output. The various filters and amplifiers shown in FIG. 2, including filter 124 and amplifier 126 in path 114, filter 134 in the second path, and filter 138 and amplifier 140, function to reject unwanted signal frequency components that result from the frequency multiplication, division, and mixing operations and to provide proper signal levels for the internal processing functions and for the output. Other implementations of a frequency synthesizer may alternatively be employed.

The remainder of the functions illustrated in FIG. 1 control phase locking of the harmonic loop 82 to the selected harmonic of the reference frequency. These functions include the marker filter 90, the zero beat detector 96, the sweep generator 98, the detector 92, and the harmonic counter 94. Since the loop 82 is equally capable of locking to any harmonic within its operating band, special provisions must be made to insure rapid but reliable lock to the selected frequency.

A first requirement of the phase lock acquisition circuitry is to know where in the range of possible phase lock points the frequency of the feedback signal to the harmonic phase comparator 62 lies. Open loop pretuning of the VCO 68 to position the frequency near the desired lock point is not sufficiently reliable for many applications, due to the tolerances associated with that process. The marker filter 90 and detector 92 functions shown in FIG. 1 provide a known reference frequency point from which the selection of a specific harmonic lock ratio can be controlled.

The marker filter 90 has a bandwidth that is narrower than the harmonic lock point spacing (i.e., the frequency spacing between adjacent lock points in the lock point range) and a center frequency that is located between two known harmonics. In the disclosed embodiment, the marker filter 90 has an exemplary bandwidth of 25 MHz centered at 6370 MHz.

Upon receipt of a frequency change command, the counter 94 is preset with a number that will result in a maximum counter output (all 1's) at the harmonic proceeding the selected harmonic. During the phase lock acquisition process, the VCO 68 frequency is swept across the operating band by the sweep generator 98. When the frequency of the feedback signal to the phase comparator 62 passes through the marker filter band, an increase in power at the filter 90 output is sensed by the detector 92 to alert the acquisition control circuitry that the reference point has been encountered. As the acquisition sweep continues beyond the reference point, harmonic lock points are sensed by the zero beat detector (ZBD) 96 and counted by the harmonic counting circuit 94. When the counter 94 is clocked to a maximum output (all 1's), the harmonic just prior to the selected harmonic has been encountered and the final phase of phase lock acquisition is initiated. During that phase, the frequency sweep rate is slowed to facilitate attaining phase lock and phase lock is allowed to occur at the next harmonic. The zero beat detector 96 detects the acquisition of phase lock and shuts off the sweep generator 96.

To minimize phase lock acquisition time, two other features are provided. First, the marker filter 90 center frequency is located in the center of the range of desired harmonic lock points, which is between harmonics 68 and 69 in the disclosed implementation. During the phase lock acquisition process, the VCO frequency is pretuned by the sweep generator 98 to place the feedback signal near the marker center frequency to avoid the need to sweep the entire band. If the desired lock point is in the upper half of the band (harmonics 69 through 74 in the current implementation), the frequency is pretuned to a point below the marker center frequency and the acquisition sweep proceeds upward in frequency until the desired lock point is reached. If the desired lock point is in the lower half of the band (harmonics 63 through 68), the frequency is pretuned to a point above the marker center frequency and the acquisition sweep proceeds downward in frequency to the lock point. Since the frequency sweep is the dominant contributor to phase lock acquisition time, that provision, which requires the sweeping of only one-half of the total operating band, results in a significant reduction in that time.

The second feature to minimize phase lock acquisition time is the use of dual sweep speeds. A very high rate is used during the initial part of the sweep by the sweep generator 98 to rapidly move through the range of nonselected harmonic lock points. That rapid sweeping is possible because the ZBD 96 and harmonic counter circuit 94 are only required to provide coarse detection and counting of the possible lock points during this phase of the acquisition process, and not to provide the accurate timing needed to stop the sweep at the desired lock point. When the harmonic lock point just prior to the selected lock point is encountered, as detected by the counter 94, the sweep rate of the sweep generator 98 is slowed to allow phase locking on the next harmonic. That slowing is necessary to improve the resolution of the ZBD 96 in timing the sweep shut off and obtaining reliable phase lock. Exemplary fast and slow sweep rates are 100 MHz/microsecond and 5 MHz/microsecond, respectively.

Figures 3A, 3B:
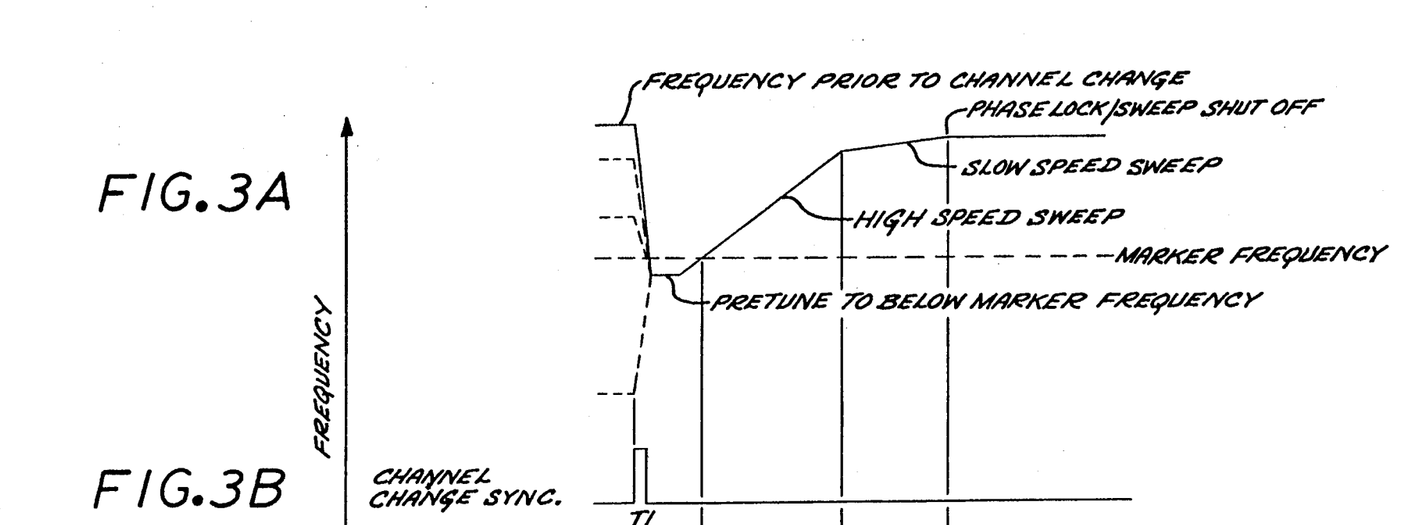
FIGS. 3A-3E illustrate harmonic lock acquisition of the generator of FIG. 1 in the upper half of the frequency band.
Figure 3C:
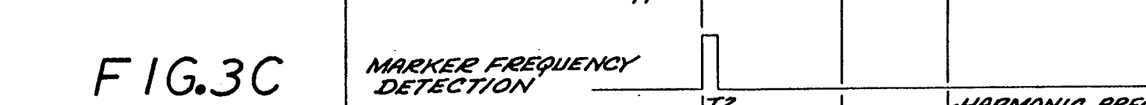
Figure 3D:
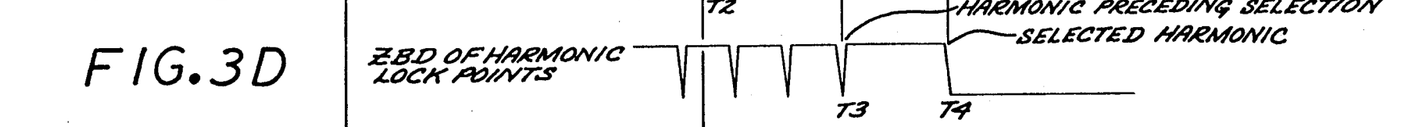
Figure 3E:
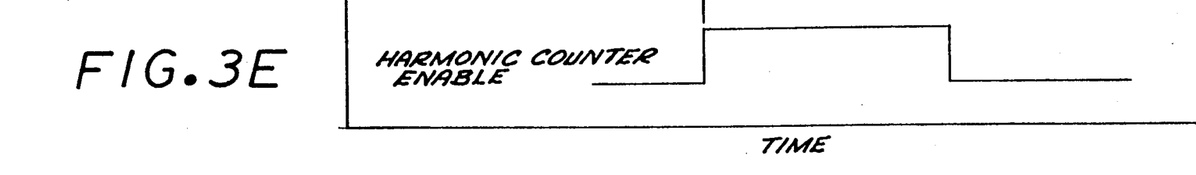
Figures 4A, 4B:
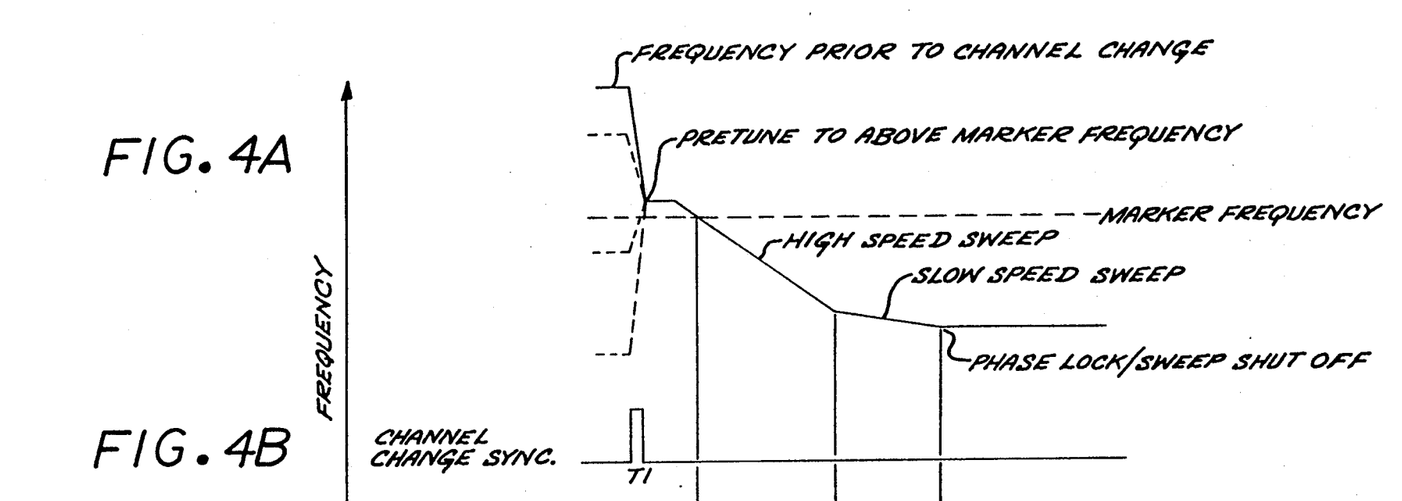
FIGS. 4A-4E illustrate harmonic lock acquisition of the generator of FIG. 1 in the lower half of the frequency band.
Figures 4C, 4D:
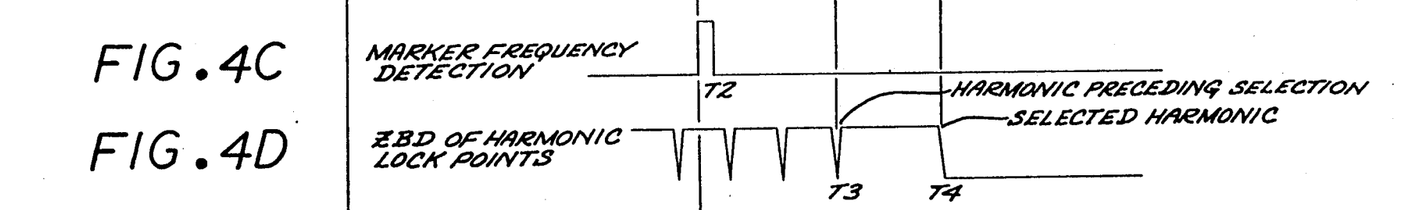
Figure 4E:
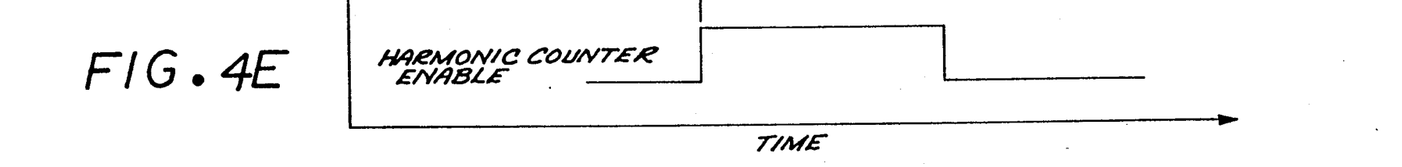

FIGS. 3A-3E illustrate the acquisition process in the upper half of the band. FIG. 3A shows the frequency of the microwave signal into the harmonic phase comparator throughout the acquisition process, relative to the fixed marker filter center frequency. The signal is at an initial frequency prior to the channel change. At time T1, a channel change synchronization pulse initiates the channel change (FIG. 3B). At this time, the sweep generator 98 is activated by a signal from the channel select logic 100 to pretune the frequency of the microwave signal to below the marker filter center frequency, and the sweep generator 98 commences sweeping upwardly in frequency at the high sweep rate. At time T2, the microwave signal frequency sweeps through the marker frequency, and this is detected by the detector 92, which generates a start pulse or counter enable signal (FIG. 3E) to the harmonic counter 94. As the sweep generator 98 continues sweeping upwardly in frequency, the ZBD 96 detects the harmonic lock points, clocking the counter 94 with each detected lock point (FIG. 3D).

When the harmonic preceding the selected harmonic frequency is detected by the ZBD 96 at time T3, the counter 94 will reach a maximum count condition which is detected and used to slow the sweep rate. At time T4, the selected harmonic is detected by the ZBD 96, and a sweep stop command is sent to the sweep generator 98 to allow phase lock to occur. The sweep stop action may be accomplished either by turning the sweep generator off and opening the connection between the sweep generator 98 and the summing network 66 by means of a switch in the sweep generator or by maintaining the connection to the summing network 66 but holding the sweep generator output voltage constant at the voltage at which phase lock was obtained. For many applications, it will be preferable to use the former sweep shut off approach to prevent sweep generator noise from adversely affecting the generator output signal. As will be apparent to those skilled in the art, the negative feedback properties of the phase locked loop will adjust the output of the loop amplification and compensation network 64 within its dynamic range as the sweep generator 98 is switched off to maintain the lock condition. The attainment of phase lock as detected by the ZBD 96 will also result in the resetting of the acquisition control functions in anticipation of the next frequency change command or of an unintentional loss of phase lock.

FIGS. 4A-4E illustrate the acquisition process in the lower half of the band. The operation is identical to that described with respect to FIGS. 3A-3D, except that the sweep generator is pretuned to above the marker filter center frequency and is swept downwardly thereafter.

Phase locking to the harmonic points that are immediately adjacent to the marker frequency is accomplished by an abbreviated version of the above sequence. For those harmonics, the counter is preset to maximum (all 1's) state and the acquisition sweep speed is immediately switched to the slow speed when the marker frequency is encountered.

Figure 5A:
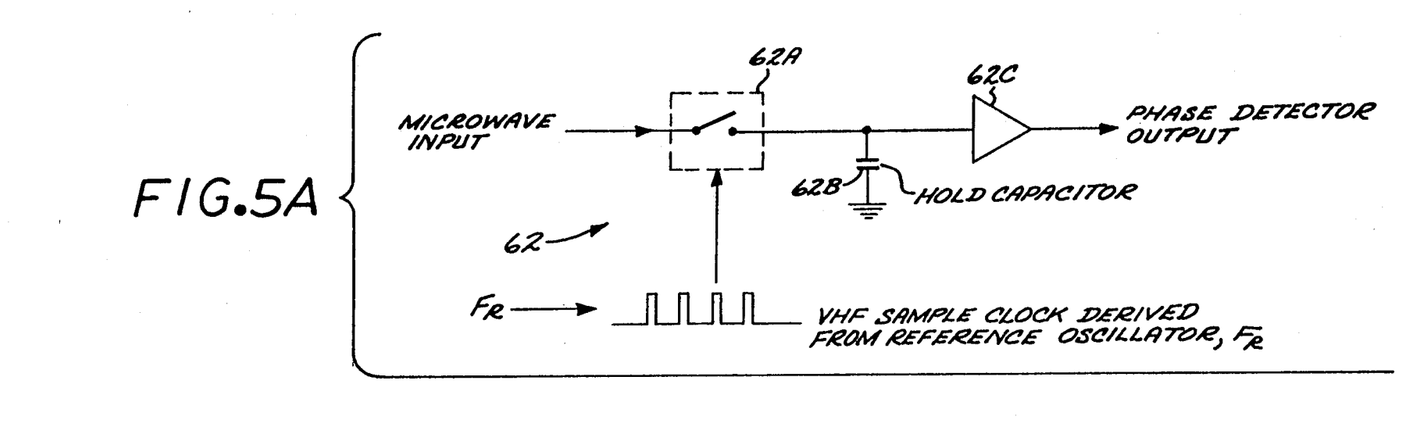
FIG. 5A illustrates one embodiment of a harmonic phase comparator such as is used in the generator of FIG. 1, and FIGS. 5B-5C illustrate the operation of the harmonic phase comparator.

FIG. 5A illustrates a simplified schematic diagram of an exemplary harmonic phase comparator suitable for use as comparator 62. Such devices are known in the art, sometimes alternatively being referred to as sampling phase comparators. The microwave input from coupler 80 (FIG. 1) is gated by a sample gate 62A to the hold capacitor 62B and amplified by a high input impedance video amplifier 62C. The sample gate 62A is a solid state switch device which is gated by a VHF sample clock derived from the reference oscillator signal $F_r$. The sample clock signal may, for example, be obtained by a step recovery diode circuit (not shown) which is responsive to the sinusoidal signal $F_r$ to produce a very narrow pulse output which is used as the sample clock. Such circuits are well known in the art.

Figure 5B:
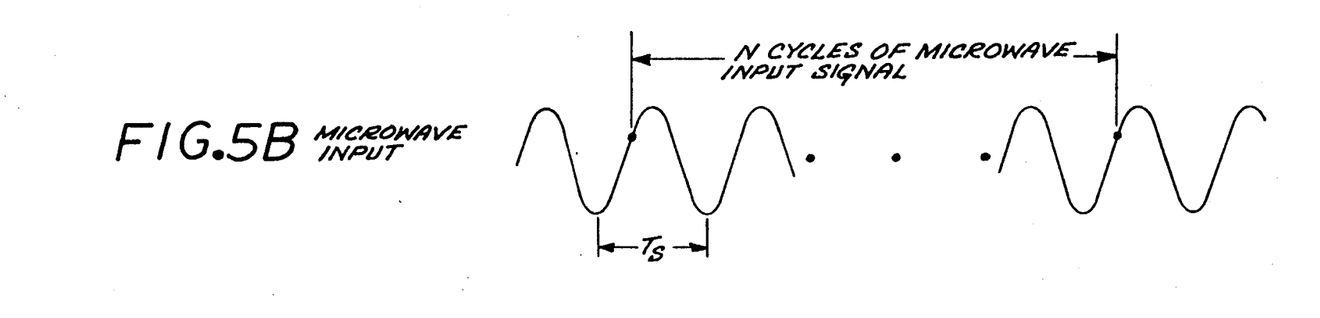
Figure 5C:
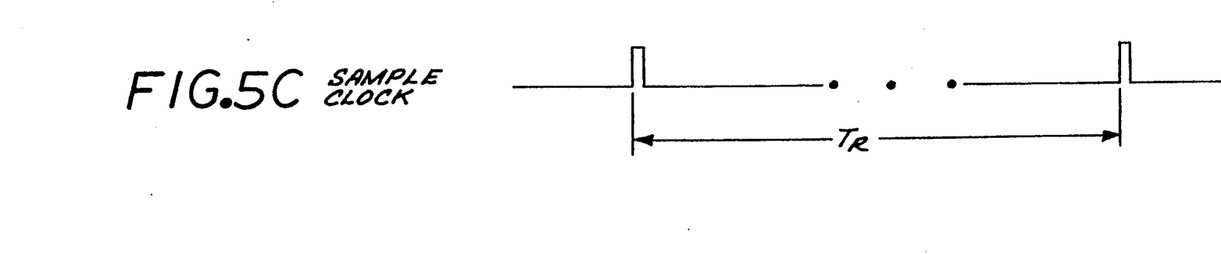

FIGS. 5B and 5C further illustrate the operation of the harmonic phase converter shown in FIG. 5A. The microwave input signal is shown in FIG. 5B as a sinusoidal signal having a period $T_s$. The sample clock is shown in FIG. 5C. The period of the sample clock is $T_R$. The frequency $F_s$ of the sample clock signal $=1/T_s$, and the frequency of signal $F_R=1/T_R$. When $T_r=NT_s$, $F_S=NF_R$, and samples occur at the same relative points on the cycles of the microwave input signal. The held sample voltage at the output of the amplifier 62C is dc, and related to the phase difference between the Nth harmonic of the reference signal and the microwave signal. The phase lock loop 82 automatically tends to locate the sample point at zero when phase locked, i.e., the loop drives the VCO to achieve a zero output from the comparator 62, so that as the phase difference changes, the sample voltage will change linearly over a limited excursion range to indicate the phase difference between the Nth harmonic of the reference signal and the microwave signal.

If phase lock is lost for reasons other than a programmed channel frequency change, that condition is sensed by circuitry that continuously monitors the state of the ZBD output. When phase locked, the phase comparator output is a dc voltage near zero volts. When unlocked, the output becomes a sinusoidal voltage signal at a frequency equal to the difference between the frequency of the feedback signal to the phase comparator and the closest harmonic of the reference. The ZBD 96 comprises a high pass filter followed by a detector/threshold circuit to distinguish between these two conditions to provide an indication of phase lock at the ZBD output. The detection of unlock by the ZBD 96 causes the reset and reinitiation of the phase lock acquisition functions to reestablish lock.

The channel select logic 100 responds to the channel select command given to the generator and provides the necessary signals to the acquisition circuitry and the synthesizer 110 to generate the output frequency indicated by the particular command. In the disclosed embodiment, the loop 82 locks to 12 possible harmonics of the reference signal, and the synthesizer 110 produces 8 different offset frequencies. Thus, this embodiment of the generator is capable of producing 12 times 8 or 96 different frequencies. As will be apparent to those skilled in the art, other embodiments can readily be implemented to provide greater numbers or different sizes for the coarse and five frequency steps. The channel select command can comprise, for example, a 7-bit digital word defining the particular one of the 96 frequencies to be generated. The logic 100 decodes the command signal to produce the signals needed to preset the harmonic counter (e.g., a 3-bit word), to instruct the sweep generator whether the frequency is in the upper of or lower half of the band (1 bit) and a control word to instruct the synthesizer 110 which frequency to generate (3 bits). In addition, the logic 100 can generate the channel select synchronization pulse which initiates the acquisition process to a new channel. The logic 100 can be implemented in a variety of ways known to those skilled in the art, e.g., combinatorial logic or microprocessor-based designs. Of course, other command signal formats could be used.

To avoid obscuring the invention, circuit design details have not been shown in FIG. 1. For example, the detector 92 will include circuits to generate the counter enable signal in response to the detection of the marker frequency; such circuitry may include, for example, an R/S flip-flop function, so that the enable signal is set at logic active state when the marker frequency is detected and is reset after phase lock is achieved. The ZBD 96 will include conditioning circuits responsive to the output of the high pass filter comprising the ZBD 96 to generate the logic level signals needed to clock the counter 94.

An exemplary embodiment of a frequency synthesized, microwave signal generator is disclosed that provides 96 channel frequencies over an 1100 MHz band, 40 microsecond channel change time, and low levels of spurious signals and noise in a highly compact design that is compatible with the needs of advanced airborne tactical radar exciters. The generator uses a microwave harmonic phase locked loop to lock a microwave VCO to a programmable harmonic of a VHF reference crystal oscillator to provide coarse frequency control in steps equal to that reference frequency. Fine frequency control in steps equal to one-eighth or other sub-multiple of the reference is provided by an L-band synthesizer. A harmonic detection and counting scheme is used to rapidly sweep the harmonic loop and obtain phase lock at the desired harmonic. Referencing of the entire generator to a single reference oscillator and the nature of the frequency plan ensure that no spurious signals will fall closer than a channel spacing away from the carrier (approximately 11 MHz for the disclosed embodiment).

The generator herein is unique in its ability to provide simultaneously optimal performance for the parameters, such as frequency stability, spectral purity, frequency agility and operating bandwidth while reducing the packaging volume substantially over prior techniques. Referencing the generator to a single reference oscillator also facilitates the attainment of ultra-high frequency stability through the use of an atomic standard such as a Rubidium reference source, when stabilities of several parts in $10^{10}$ are needed. FM noise is also established by a single reference oscillator and can be more easily optimized than in generators where a number of reference oscillators are used. The invention also extends band coverage to twelve percent for the embodiment described from the conventional band of typically four percent. The approach of the invention, however, can be implemented for arbitrarily wider band coverage without departing from the scope of the invention.

It is understood that the above-described embodiments are merely illustrative of the possible specific embodiments which may represent principles of the present invention. Other arrangements may readily be devised in accordance with these principles by those skilled in the art without departing from the scope of the invention.

What is claimed is:

1. A frequency synthesized, microwave signal generator, comprising:
    a reference oscillator for generating a reference signal at a reference frequency;
    a programmable harmonic phase lock loop (PLL) responsive to said reference signal, said loop being closed around a harmonic phase comparator, a voltage controlled oscillator (VCO), the generator output signal being taken at the output of the VCO, and an offset signal mixer for mixing the VCO signal with a fine frequency control offset signal, the output of the offset mixer comprising a microwave signal fed back to the harmonic phase comparison for comparison with the reference signal, wherein the PLL may be programmably locked to a harmonic of the reference signal;
    a frequency synthesizer for generating said fine frequency control signal;
    means for programming the harmonic PLL to a selected one of a plurality N of harmonics of the reference frequency for providing coarse step frequency control of the generator output signal; and
    means for controlling said frequency synthesizer to generate a fine frequency control signal at a desired frequency so as to achieve fine frequency control of the output signal;

whereby coarse step and fine frequency control are achieved by the generator in a single phase lock loop.

2. The generator of claim 1 wherein said reference signal serves to provide a reference frequency for said frequency synthesizer.

3. The generator of claim 1 wherein said frequency synthesizer comprises a programmable frequency synthesizer for generating a fine frequency control signal having one of a plurality M of frequencies, wherein said generator can programmably generate one of N times M possible frequencies.

4. The generator of claim 1 wherein said means for programming the harmonic PLL comprises:
   a sweep generator for generating a sweep signal which is swept in amplitude;
   loop amplifier means for amplifying the phase comparator output signal to provide a loop amplified comparator signal;
   voltage summing means for summing the sweep signal and the amplified comparator signal to provide a VCO control signal, wherein the frequency of the VCO output signal is determined by the VCO control signal;
   a marker bandpass filter responsive to the microwave signal and having a pass band narrower than the frequency separation between adjacent harmonics of the reference signal, the center frequency of said pass band being disposed within the frequency band of operation of the generator; and
   a detector responsive to the marker filter output for detecting signal frequencies around the marker center frequency and providing a detector signal indicating that the microwave signal frequency is at or near the marker center frequency to establish a reference frequency point for the acquisition process.

5. The generator of claim 4 wherein the programming means further comprising means responsive to a channel select command indicating the channel frequency to which the generator is to be set for initializing the sweep generator signal to a level which results in a microwave signal frequency just below the marker center frequency if the selected frequency is in the upper part of the frequency band and thereafter sweeping the microwave signal frequency upwardly to toward the selected frequency, and for initializing the sweep generator signal to a level which results in a microwave signal frequency just above the marker center frequency if the selected frequency is in the lower part of the frequency band, and for thereafter sweeping the microwave signal frequency downwardly toward the selected frequency, whereby the acquisition speed of the generator is increased since the loop is swept over at most about one half of the band covering the desired harmonic lock points.

6. The generator of claim 4 further comprising means for causing said sweep generator to sweep at a first, high rate during an initial phase of the acquisition process, and to thereafter sweep at a second, relatively low rate to acquire phase lock, thereby further increasing the acquisition speed of the generator.

7. The generator of claim 1 wherein said programming means comprises:
   a sweep generator for generating a sweep signal which is swept in amplitude;
   loop amplifier means for amplifying the phase comparator output signal to provide an amplified loop comparator signal;
   voltage summing means for summing the sweep signal and the amplified comparator signal to provide a VCO control signal, wherein the frequency of the VCO output signal is determined by the VCO control signal;
   means for generating a marker reference signal when the microwave signal is swept through a predetermined marker frequency;
   means for detecting when the microwave signal frequency is at a harmonic of the reference signal frequency and generating a harmonic detector signal;
   means responsive to the harmonic detector signal for counting the number of harmonic frequencies through which the microwave signal has been swept and generating a first sweep generator control signal when the microwave signal is at the desired harmonic of the reference signal frequency.

8. The generator of claim 7 wherein said counting means comprises a digital counter means enabled by said harmonic detector signal and clocked each time said microwave signal frequency reaches a harmonic of said reference signal frequency, said counter means generating a counter state signal for controlling the operation of said sweep generator.

9. The generator of claim 8 wherein said generator further comprises a controller means for controlling the frequency acquisition operation of said generator in response to channel select commands, said means comprising:
   means responsive to said select command for generating a preset signal to said counter setting the start count of said counter, said start count being related to the desired harmonic of the reference frequency to be generated;
   means responsive to said select command for generating a second sweep generator control signal initiating operation of said sweep generator; and
   means for generating a frequency synthesizer control signal for controlling the synthesizer to generate a fine frequency control signal at a desired frequency so as to achieve fine frequency control of the output signal.

10. The generator of claim 9 wherein said selected harmonic frequency is the Nth harmonic of the reference frequency, and said start count of said counter is selected so that said counter will generate said first sweep generator control signal when the microwave signal frequency reaches the N-1th harmonic of the reference signal, and wherein said sweep generator comprises means responsive to said second sweep generator signal for commencing said sweeping operation at a first relatively high sweep rate, and means responsive to said first sweep control signal for reducing the sweep rate to a second relatively slow sweep rate, and wherein said counting means further comprises means for generating a third sweep control signal when the microwave signal frequency reaches the Nth harmonic of the reference frequency.

11. The generator of claim 1 wherein said programming means comprises means for generating a frequency marker signal when the microwave signal frequency is at a predetermined marker frequency, said marker frequency located in the center of the range of desired harmonic lock points.

* * * * *